US012205882B2

(12) United States Patent
Niccum et al.

(10) Patent No.: US 12,205,882 B2
(45) Date of Patent: Jan. 21, 2025

(54) METHODS AND DEVICES USING MICROCHANNELS FOR INTERCONNECTIONS

(71) Applicant: 3M INNOVATIVE PROPERTIES COMPANY, St. Paul, MN (US)

(72) Inventors: Kayla C. Niccum, Maplewood, MN (US); Ankit Mahajan, Cupertino, CA (US); Saagar A. Shah, Minneapolis, MN (US); Kara A. Meyers, Oakdale, MN (US); Mikhail L. Pekurovsky, Bloomington, MN (US); Jonathan W. Kemling, Woodbury, MN (US); David C. Mercord, Prescott, WI (US); Pranati Mondkar, Minneapolis, MN (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 419 days.

(21) Appl. No.: 17/754,028

(22) PCT Filed: Sep. 17, 2020

(86) PCT No.: PCT/IB2020/058677
§ 371 (c)(1),
(2) Date: Mar. 22, 2022

(87) PCT Pub. No.: WO2021/059092
PCT Pub. Date: Apr. 1, 2021

(65) Prior Publication Data
US 2022/0367325 A1 Nov. 17, 2022

Related U.S. Application Data

(60) Provisional application No. 62/904,830, filed on Sep. 24, 2019.

(51) Int. Cl.
*H01L 23/498* (2006.01)
*H01L 23/00* (2006.01)
*H01L 23/31* (2006.01)

(52) U.S. Cl.
CPC ...... *H01L 23/4985* (2013.01); *H01L 23/3121* (2013.01); *H01L 23/49827* (2013.01);
(Continued)

(58) Field of Classification Search
CPC ............ H01L 23/4985; H01L 23/3121; H01L 23/49827; H01L 2224/24137;
(Continued)

(56) References Cited

U.S. PATENT DOCUMENTS

| | | | |
|---|---|---|---|
| 2015/0279828 A1* | 10/2015 | Koopmans | H01L 24/17 257/713 |
| 2016/0183376 A1* | 6/2016 | Gowda | H01L 23/49827 361/783 |
| 2021/0210427 A1* | 7/2021 | Kang | H01L 24/20 |

FOREIGN PATENT DOCUMENTS

| | | |
|---|---|---|
| EP | 1720389 | 11/2005 |
| EP | 1976355 | 10/2008 |

(Continued)

OTHER PUBLICATIONS

International Search Report for PCT International Application No. PCT/IB2020/058677, mailed on Jan. 21, 2021, 5 pages.

*Primary Examiner* — Mohammad A Rahman
(74) *Attorney, Agent, or Firm* — Thomas M. Spielbauer

(57) ABSTRACT

A pattern of microchannels is formed on a major surface of a substrate on the side opposite an adhesive surface thereof. Through holes extend through the substrate and are connected to the pattern of microchannels. Solid circuit dies are adhesively bonded to the adhesive surface of the substrate. The contact pads of the solid circuit dies at least partially overlie and face the through holes. Electrically conductive
(Continued)

channel traces are formed to electrically connect to the solid circuit dies via the through holes.

20 Claims, 7 Drawing Sheets

(52) U.S. Cl.
CPC .............. *H01L 24/24* (2013.01); *H01L 24/32* (2013.01); *H01L 24/92* (2013.01); *H01L 2224/24137* (2013.01); *H01L 2224/32225* (2013.01); *H01L 2224/92144* (2013.01)

(58) Field of Classification Search
CPC . H01L 2224/32225; H01L 2224/92144; H01L 23/49883; H01L 2224/04105; H01L 2224/83192; H01L 24/00–98; H01L 2224/00–98; H05K 3/125; H05K 3/305; H05K 1/03

See application file for complete search history.

(56) References Cited

FOREIGN PATENT DOCUMENTS

| | | |
|---|---|---|
| JP | 2002290029 | 10/2002 |
| KR | 1020180090941 | 8/2018 |
| WO | WO 2020-141407 | 7/2020 |

\* cited by examiner

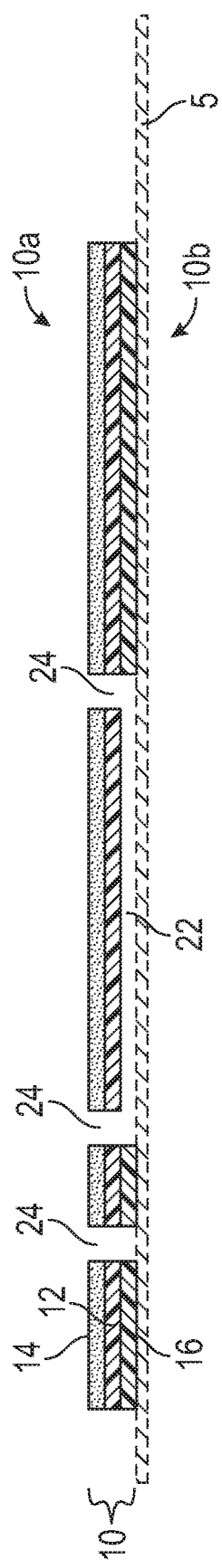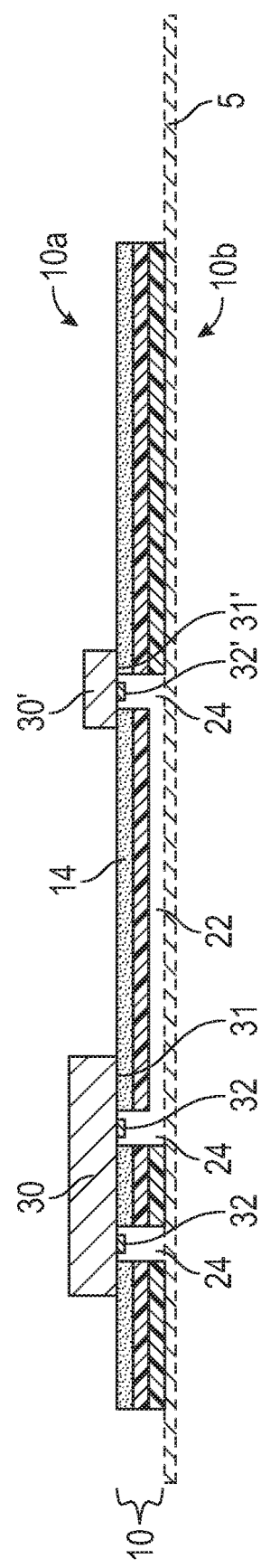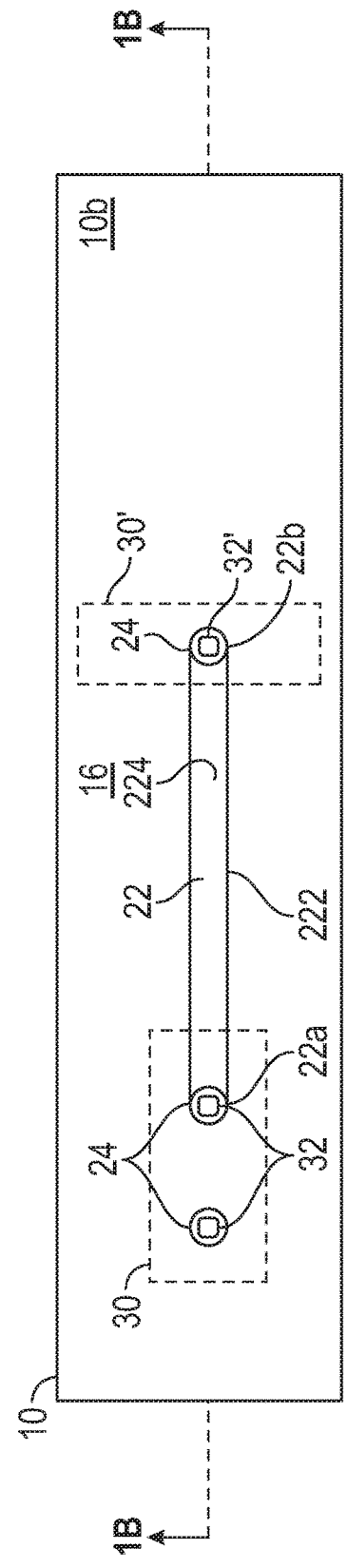
FIG. 1A
FIG. 1B
FIG. 1C

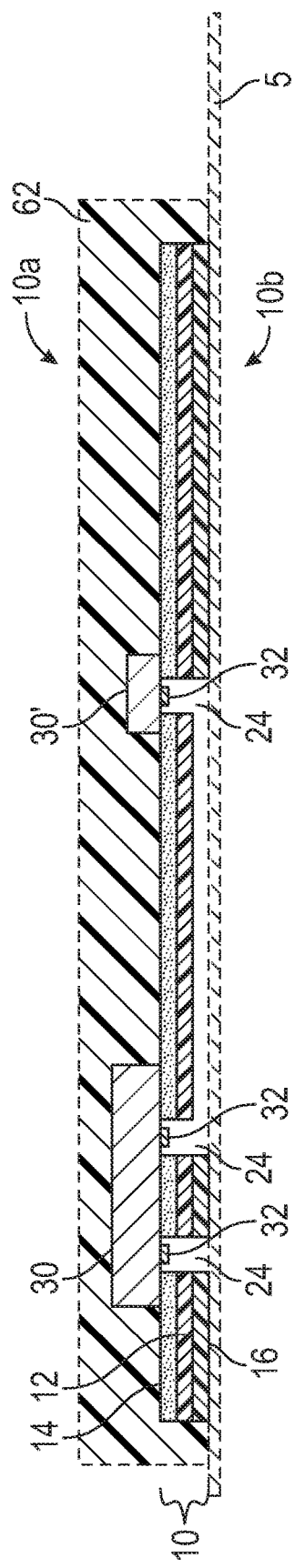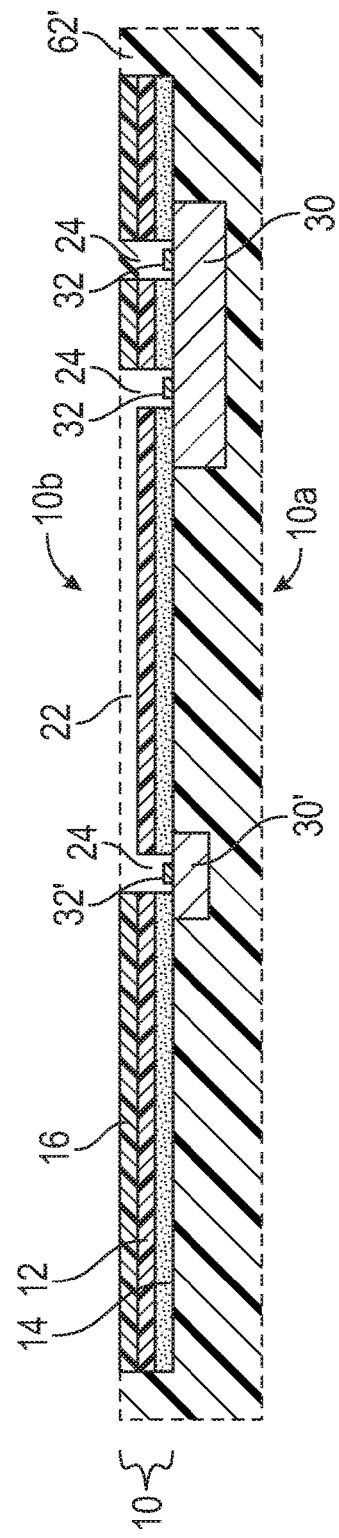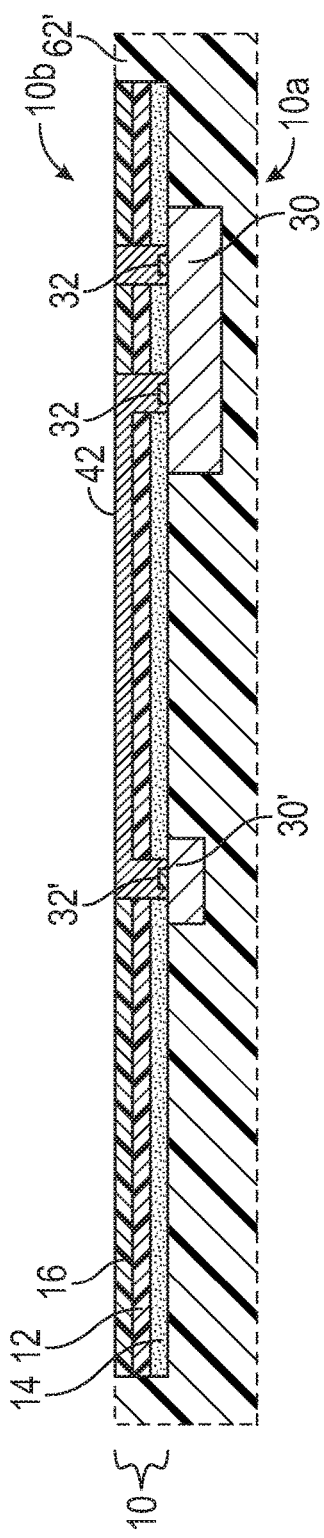

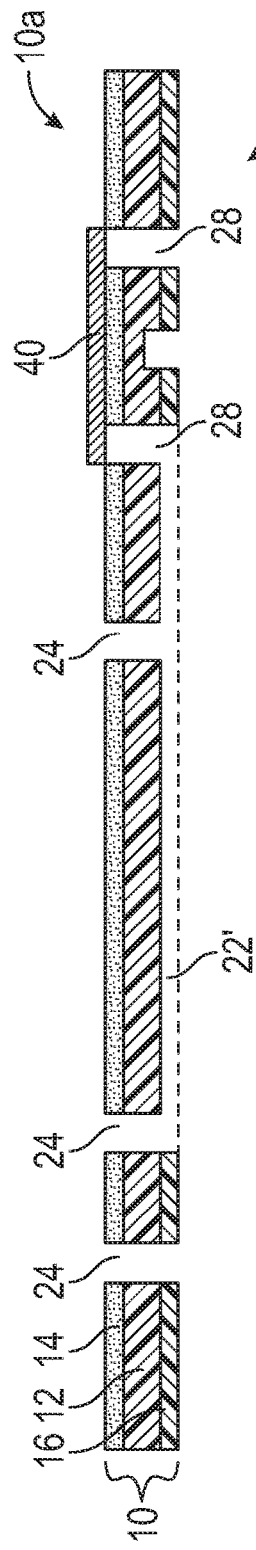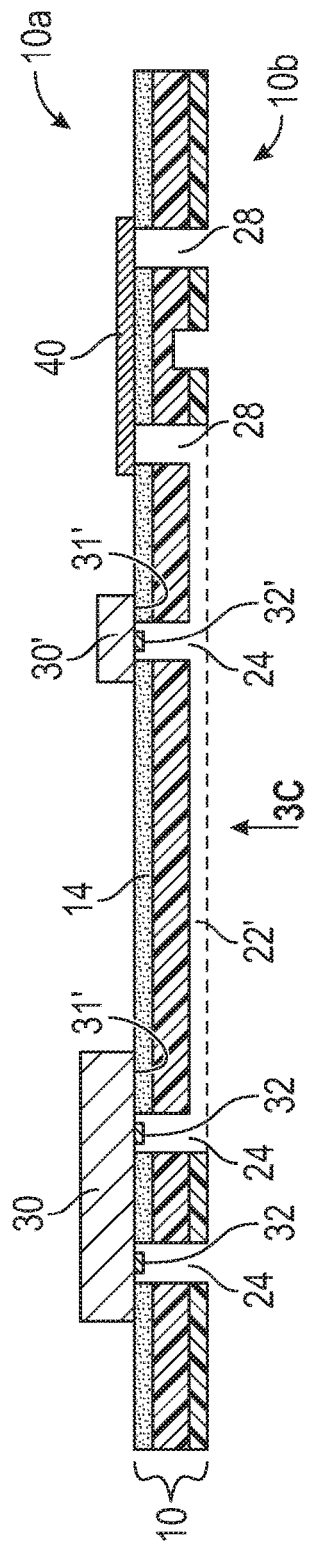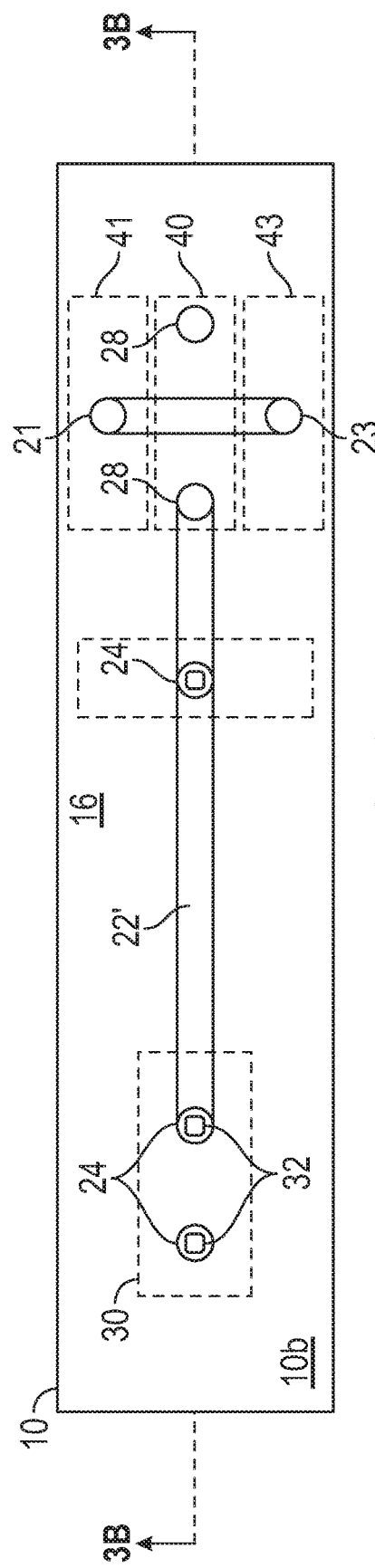
FIG. 3A
FIG. 3B
FIG. 3C

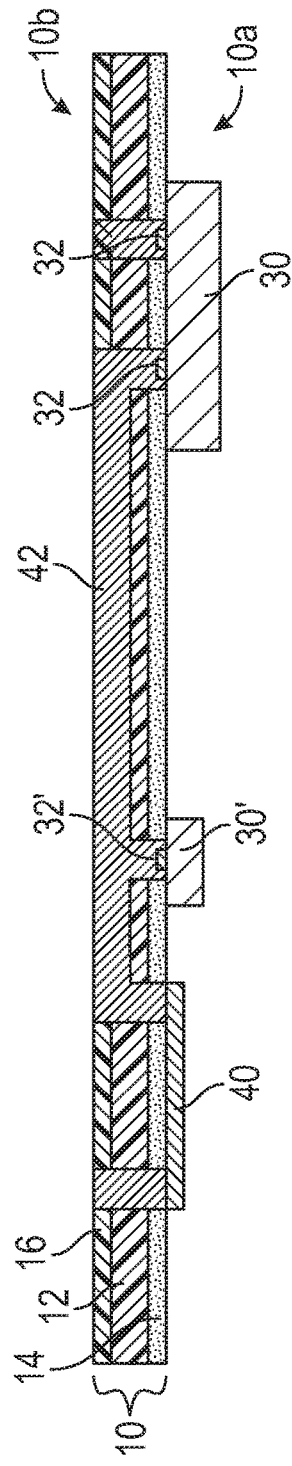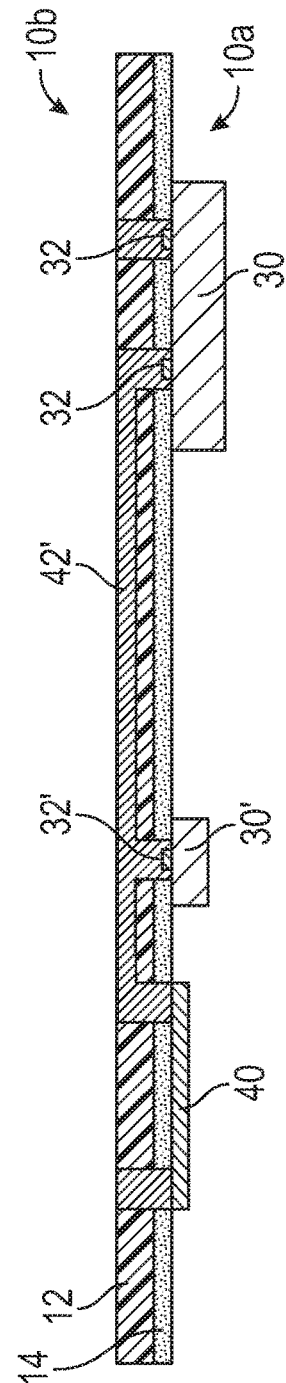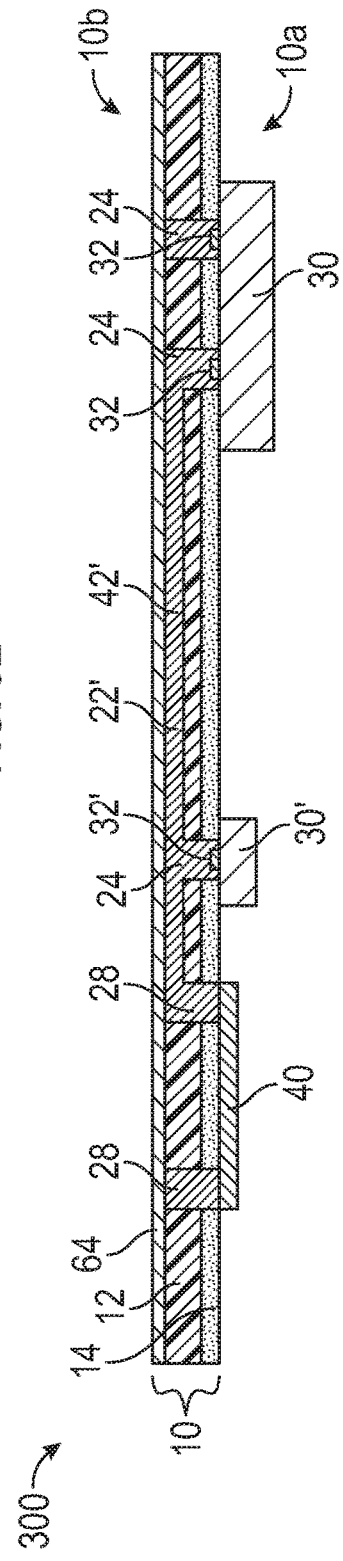

METHODS AND DEVICES USING MICROCHANNELS FOR INTERCONNECTIONS

CROSS REFERENCE TO RELATED APPLICATIONS

This application is a national stage filing under 35 U.S.C. 371 of PCT/IB2020/058677, filed Sep. 17, 2020, which claims the benefit of U.S. Application No. 62/904,830, filed Sep. 24, 2019, the disclosure of which is incorporated by reference in its/their entirety herein.

BACKGROUND

Integration of solid semiconductor dies with printing techniques combines the computational prowess of semiconductor technology with the high-throughputs and form-factor flexibility of web-based processes. Flexible hybrid electronics manufacturing requires that semiconductor dies be reliably and accurately registered to printed traces on moving webs. Alignment mechanisms suitable for wafer-based semiconductor devices may not be readily transferred to web-based processes.

SUMMARY

Briefly, in one aspect, the present disclosure describes an electronic device including a flexible substrate. The flexible substrate includes an adhesive surface on a first major side thereof, a pattern of microchannels on a second major side opposite the first major side, and one or more through holes connected to the pattern of microchannels, at least one of the through holes extending through the substrate between the first and second major sides. One or more solid circuit dies are adhesively bonded to the adhesive surface of the substrate such that one or more contact pads of the solid circuit dies at least partially overlie and face the one or more through holes of the substrate.

In another aspect, the present disclosure describes a method of making an electronic device. The method includes providing a flexible substrate having an adhesive surface on a first major side thereof; providing a pattern of microchannels on a second major side of the substrate opposite the adhesive surface; providing one or more through holes connected to the pattern of microchannels, at least one of the through holes extending through the substrate between the first and second major sides; providing a solid circuit die on the adhesive surface of the substrate such that one or more contact pads of the solid circuit die at least partially overlie and face the one or more through holes of the substrate; providing a conductive particle-containing liquid in the pattern of microchannels and the one or more through holes to contact the one or more contact pads; and solidifying the conductive particle-containing liquid to form one or more electrically conductive channel traces to electrically connect to the one or more contact pads of the solid circuit die.

Various unexpected results and advantages are obtained in exemplary embodiments of the disclosure. One such advantage of exemplary embodiments of the present disclosure is that microchannels and through holes can be created on a flexible substrate to form electrically conductive traces to electrically connect circuit components of a multi-layered circuit including one or more solid circuit dies.

Various aspects and advantages of exemplary embodiments of the disclosure have been summarized. The above Summary is not intended to describe each illustrated embodiment or every implementation of the present certain exemplary embodiments of the present disclosure. The Drawings and the Detailed Description that follow more particularly exemplify certain preferred embodiments using the principles disclosed herein.

BRIEF DESCRIPTION OF THE DRAWINGS

The disclosure may be more completely understood in consideration of the following detailed description of various embodiments of the disclosure in connection with the accompanying figures, in which:

FIG. 1A is a cross-sectional view of a substrate, according to one embodiment.

FIG. 1B is a cross-sectional view of the substrate of FIG. 1A having circuit dies disposed thereon, according to one embodiment.

FIG. 1C is a plan view of the substrate of FIG. 1B.

FIG. 1D is a cross-sectional view of the substrate of FIG. 1B where a liquid encapsulant material is applied, according to one embodiment.

FIG. 1E is a cross-sectional view of the substrate of FIG. 1D where an optional liner is removed, according to one embodiment.

FIG. 1F is a cross-sectional view of the substrate of FIG. 1D where a conductive ink is applied, according to one embodiment.

FIG. 2A' illustrates a process of forming the substrate of FIG. 2A, according to one embodiment.

FIG. 3A is a cross-sectional view of a substrate, according to one embodiment.

FIG. 3B is a cross-sectional view of the substrate of FIG. 3A having circuit dies disposed thereon, according to one embodiment.

FIG. 3C is a plan view of the substrate of FIG. 3B.

FIG. 3D is a cross-sectional view of the device of FIG. 3B where a conductive ink is applied, according to one embodiment.

FIG. 3E is a cross-sectional view of the substrate of FIG. 3D where a liner is removed from the substrate, according to one embodiment.

FIG. 3F is a cross-sectional view of the substrate of FIG. 3E where an overcoat layer is applied onto the substrate, according to one embodiment.

Figure 1G:
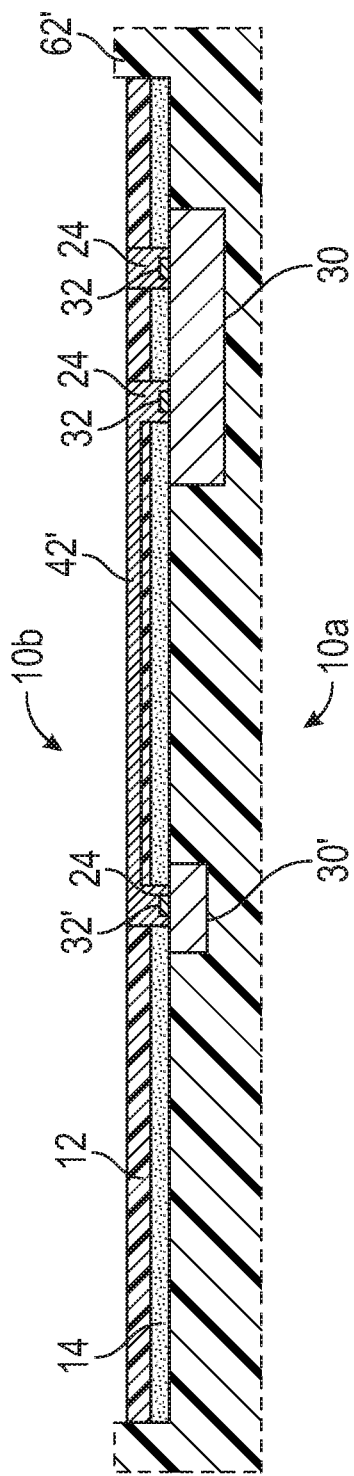
FIG. 1G is a cross-sectional view of the substrate of FIG. 1F where a liner is removed from the substrate, according to one embodiment.

In the drawings, like reference numerals indicate like elements. While the above-identified drawing, which may not be drawn to scale, sets forth various embodiments of the present disclosure, other embodiments are also contemplated, as noted in the Detailed Description. In all cases, this disclosure describes the presently disclosed disclosure by way of representation of exemplary embodiments and not by express limitations. It should be understood that numerous other modifications and embodiments can be devised by those skilled in the art, which fall within the scope and spirit of this disclosure.

DETAILED DESCRIPTION

For the following Glossary of defined terms, these definitions shall be applied for the entire application, unless a different definition is provided in the claims or elsewhere in the specification.

Glossary

Certain terms are used throughout the description and the claims that, while for the most part are well known, may require some explanation. It should be understood that:

By using terms of orientation such as "atop", "on", "over," "covering", "uppermost", "underlying" and the like for the location of various elements in the disclosed coated articles, we refer to the relative position of an element with respect to a horizontally-disposed, upwardly-facing substrate. However, unless otherwise indicated, it is not intended that the substrate or articles should have any particular orientation in space during or after manufacture.

By using the term "overcoated" to describe the position of a layer with respect to a substrate or other element of an article of the present disclosure, we refer to the layer as being atop the substrate or other element, but not necessarily contiguous to either the substrate or the other element.

By using the term "separated by" to describe the position of a layer with respect to other layers, we refer to the layer as being positioned between two other layers but not necessarily contiguous to or adjacent to either layer.

The terms "about" or "approximately" with reference to a numerical value or a shape means+/−five percent of the numerical value or property or characteristic, but expressly includes the exact numerical value. For example, a viscosity of "about" 1 Pa-sec refers to a viscosity from 0.95 to 1.05 Pa-sec, but also expressly includes a viscosity of exactly 1 Pa-sec. Similarly, a perimeter that is "substantially square" is intended to describe a geometric shape having four lateral edges in which each lateral edge has a length which is from 95% to 105% of the length of any other lateral edge, but which also includes a geometric shape in which each lateral edge has exactly the same length.

The term "substantially" with reference to a property or characteristic means that the property or characteristic is exhibited to a greater extent than the opposite of that property or characteristic is exhibited. For example, a substrate that is "substantially" transparent refers to a substrate that transmits more radiation (e.g. visible light) than it fails to transmit (e.g. absorbs and reflects). Thus, a substrate that transmits more than 50% of the visible light incident upon its surface is substantially transparent, but a substrate that transmits 50% or less of the visible light incident upon its surface is not substantially transparent.

As used in this specification and the appended embodiments, the singular forms "a", "an", and "the" include plural referents unless the content clearly dictates otherwise. Thus, for example, reference to fine fibers containing "a compound" includes a mixture of two or more compounds. As used in this specification and the appended embodiments, the term "or" is generally employed in its sense including "and/or" unless the content clearly dictates otherwise.

As used in this specification, the recitation of numerical ranges by endpoints includes all numbers subsumed within that range (e.g. 1 to 5 includes 1, 1.5, 2, 2.75, 3, 3.8, 4, and 5).

Unless otherwise indicated, all numbers expressing quantities or ingredients, measurement of properties and so forth used in the specification and embodiments are to be understood as being modified in all instances by the term "about." Accordingly, unless indicated to the contrary, the numerical parameters set forth in the foregoing specification and attached listing of embodiments can vary depending upon the desired properties sought to be obtained by those skilled in the art utilizing the teachings of the present disclosure. At the very least, and not as an attempt to limit the application of the doctrine of equivalents to the scope of the claimed embodiments, each numerical parameter should at least be construed in light of the number of reported significant digits and by applying ordinary rounding techniques.

Exemplary embodiments of the present disclosure may take on various modifications and alterations without departing from the spirit and scope of the present disclosure. Accordingly, it is to be understood that the embodiments of the present disclosure are not to be limited to the following described exemplary embodiments, but is to be controlled by the limitations set forth in the claims and any equivalents thereof. Various exemplary embodiments of the disclosure will now be described with particular reference to the Drawings.

FIGS. 1A-H illustrate a method of making an electronic device 100 using a substrate 10, according to some embodiments. The substrate 10 includes a flexible backing layer 12 with an adhesive surface 14 on a first side 10a thereof. The substrate 10 further includes a removable liner 16 attached to the flexible backing layer 12 on a second side 10b thereof, opposite to the first side 10a. An optional liner 5 is provided on the side of the liner 16 to support the substrate 10.

In many embodiments, the substrate 10 may be a portion of a continuous web and the liner 5 is not required to support the substrate 10. The web may be used in a high-speed, roll-to-roll manufacturing process to electrically connect circuit components to rapidly produce low-cost circuits for electronic devices including, for example, radio-frequency identification (RFID) tags, near field communication (NFC) circuits, Bluetooth circuits, Wi-Fi circuits, microprocessor chips, bare dies, capacitors, accelerometer chips, and the like. Multiple devices may be constructed on the same substrate 10.

A pattern of microchannels 22 is provided on the second side 10b of the substrate 10. The microchannels 22 can be formed by cutting completely through the liner 16 and partially into the flexible backing layer 12. One or more through holes 24 are provided to fluidly connect to one or more of the microchannels 22. The through holes 24 can be formed by cutting completely through the liner 16, the flexible backing layer 12, and the adhesive 14. For example, in the embodiment depicted in FIG. 1C, two through holes 24 are provided to fluidly connect to the two ends 22a and 22b of the microchannel 22. The through holes 24 each extend through the substrate 10 between the first and second sides 10a and 10b.

In various embodiments, the microchannels 22 may have a minimum dimension (e.g., any of length or width/thickness) of, for example, 500 micrometers or less, 300 micrometers or less, 100 micrometers or less, 50 micrometers or less, or 10 micrometers or less. One exemplary microchannel may have a width of about 50 to about 500 micrometers, and a depth of about 10 to 100 micrometers. In some embodiments, the through holes 24 may have a minimum dimension comparable to that of the microchannels 22. One exemplary through hole may have a diameter of about 50 to about 1000 micrometers, about 100 to about 1000 micrometers, or about 300 to about 700 micrometers. In some embodiments, the depth of a through hole may be greater than its diameter to extend through the substrate. In some embodiments, the through holes 24 may have a semi-cone shape, which may be resulted from a laser cutting. For example, a through hole may have a first diameter on the first side 10a and a second diameter on the second side 10b, where the first diameter is smaller than the second diameter.

The microchannels 22 and the through holes 24 may be formed in the substrate 10 by any suitable technique such as, for example, chemical etching, laser etching or drilling, mechanical punching, casting against a microstructured metal or polymeric tool, etc. While one arrangement of microchannels 22 is shown in the embodiment of FIGS. 1A-H, it is to be understood that any other numbers of channels and through holes can be formed on the substrate 10, and the channels and through holes can be fluidly connected in various configurations.

The flexible backing layer 12 can include any flexible material such as, for example, polyurethane, rubber, epoxy, polyethylene terephthalate (PET), polyethylene, polystyrene, silicone elastomer (e.g. PDMS), etc. In one example prepared in this disclosure, a polyurethane film was used as a flexible substrate, which is commercially available from 3M Company St. Paul, MN, under the trade designation of COTRAN 9701. It is to be understood in some embodiments, a portion of the flexible backing layer 12 may be rigid, while the flexible backing layer 12 as a whole can be flexible. The flexible backing layer 12 may be elastic, having a modulus in the range, for example, between 0.1 MPa to 10 GPa.

The adhesive surface 14 can include any suitable adhesive materials to adhesively bond a solid circuit die onto the flexible backing layer 12. In general, an adhesive material used herein can provide an adhesion strong enough such that the dies may not be easily displaced from their original position during subsequent handling. In some embodiments the dies may be removed and/or repositioned without significantly damaging the backing layer. In some embodiments the adhesive force may be high enough that the dies may not be easily removed or displaced without significantly damaging the backing layer. The adhesive material may also be capable of maintaining its structure, e.g., not reflowing into an adjacent through hole or microchannel. Exemplary adhesives may include structural adhesives, pressure sensitive adhesives, acrylic adhesives, epoxy adhesive, urethane adhesives, optical adhesives, silicone-based adhesives, etc.

In some embodiments, two-stage structural adhesives can be applied. For example, circuit dies can be placed on a pressure-sensitive adhesive (PSA) which can be cured in a second step to form a structural adhesive. A suitable two-stage structural adhesive may experience a first curing step that initiates or catalyzes a reaction and enable some repositionability followed by a second curing step that finishes the reaction. In this case, "cure" means to cause a hardening or an increase in viscosity through a physical or chemical reaction such as, for example, by exposure to electromagnetic radiation or heating.

In some embodiments, the adhering can be performed with, for example, a UV curable polyurethane compound. In some embodiments, a uniform layer of adhesive material can be provided onto the flexible backing layer. In some embodiments, the adhesive material can be selectively applied onto the flexible backing layer where a circuit die is to be attached.

One or more solid circuit dies can be provided to attach to the adhesive surface 14 of the substrate 10. Each solid circuit die has a major surface thereof being adhesively bonded to the adhesive surface 14. In the embodiment depicted in FIG. 1B, solid circuit dies 30 and 30' have their respective major surfaces 31 and 31' being adhesively bonded to the adhesive surface 14 of the substrate 10. The solid circuit dies 30 and 30' each include one or more contact pads (e.g., contact pads 32 and 32') on the respective major surfaces 31 and 31'. The solid circuit dies 30 and 30' are aligned with respect to the substrate 10 such that the contact pads 32 and 32' at least partially overlie the corresponding through holes 24 of the substrate 10. In the depicted embodiment of FIG. 1C, the solid circuit dies 30 and 30' each have one of its contact pads 32 and 32' being received by the corresponding through holes 24 which are fluidly connect to the two ends 22a and 22b of the microchannel 22. In the depicted embodiment of FIG. 1C, the contact pads 32 and 32' are shown extending into the through holes 24, but it is to be understood that the contact pads 32 and 32' may not extend beyond the major surfaces 31 or 31'. The contact pads may have a smaller, roughly equivalent, or larger diameter than the through hole.

A solid circuit die described herein can include one or more circuit chips having certain circuitry function(s). In some embodiments, a solid circuit die may include a circuit chip having one or more contact pads arranged along a surface thereof, a rigid semiconductor die, a printed circuit board (PCB), a flexible printed circuit (FPC), an ultra-thin chip, a radio frequency identification device (RFID), a near field communication (NFC) module, surface-mount devices, etc. In some embodiments a solid circuit die may include components such as LEDs, resistors, capacitors, switches, accelerometers, thermocouples, pressure sensors, light sensors, or any other appropriate component. In some embodiments a solid circuit die may include batteries, such as coin cell batteries or thin film batteries, battery tabs, battery housings, or other connectors that may be used to provide power to the device. In some embodiments, a solid circuit die can be an ultra-thin chip with a thickness of about 2 micrometers to about 200 micrometers, about 5 micrometers to about 100 micrometers, or about 10 micrometers to about 100 micrometers.

In some embodiments, a solid circuit die can include a rigid or flexible semiconductor die. In some embodiments, a solid circuit die can include a printed circuit board (PCB). In some embodiments, a solid circuit die can include a flexible printed circuit (FPC). In some embodiments, a solid circuit die may include electrically conductive plates or traces. It is to be understood that the solid circuit dies described herein can include any suitable circuits to be disposed on a substrate. In some embodiments, one or more contact pads of a solid circuit die or the solid circuit die itself can be registered and connected to electrically conductive traces on a substrate.

In the embodiment depicted in FIG. 1D, a liquid encapsulant material 62 is applied onto the first side 10a of the substrate 10 to encapsulate at least a portion of the substrate 10 and the solid circuit dies 30 and 30' attached thereon. In some embodiments the liquid encapsulant material may be in contact with only a portion of the first side 10a of the substrate 10. In some embodiments the liquid encapsulant material may flow around the edges of substrate 10, enclosing multiple sides of substrate 10, as depicted in FIG. 1D. In various embodiments, the liquid encapsulant material 62 may include, for example, a dielectric material, a polymeric material, and the like. Examples of suitable liquid encapsulant materials 62 include, for example, polyurethane, epoxy, polythiolene, acrylates including urethane acrylates, silicones, silicone acrylates, and polydimethylsiloxane (PDMS). The liquid encapsulant material 62 can flow around and cover the circuit dies 30 and 30' and other components on the first side 10a of the substrate 10. In some embodiments, the liquid encapsulant material 62 can be solidified by any suitable technique including, but not limited to, heating, application of radiation such as ultraviolet (UV), and combinations thereof, Once solidified, the liquid encapsulant material 62 can form an encapsulating layer 62' as shown in FIG. 1E, where the optional liner 5 is removed from the second side 10b of the substrate 10 and the microchannels 22 and the through holes 24 are revealed.

The encapsulating layer 62' can help to secure the circuit dies 30 and 30' on the substrate 10, and also provide protection to the circuit dies both from impact as well as other environmental conditions, such as water, moisture, solvents, etc. It is to be understood that the encapsulating layer 62' is optional. In many embodiments, the adhesive surface 14 of the substrate 10 can form relative strong adhesive bonding to secure one or more circuit dies disposed thereon, which may make the encapsulating layer 62' unnecessary. For example, a strong bonding can be obtained between the circuit die and the substrate by using a structural adhesive, where the substrate 10 can be flexibly bent or stretched without having the circuit dies to peel or pop off. Suitable structure adhesives may include, for example, polyurethane, epoxy, silicones, urethane-acrylates, etc.

In terms of securing a circuit die to a substrate via an adhesive, it is to be understood that a strain experienced at the interface thereof may play a role. For example, a circuit die on a relatively weak adhesive may work if the substrate does not undergo significant strain, i.e. through stretching or bending. On the other extreme, a circuit die adhered to a substrate via a relatively strong adhesive bonding may still delaminate if subjected to a small bending radius, for example.

With the circuit dies secured in position, a conductive particle-containing liquid can be disposed in the microchannels 22 and the through holes 24 which are fluidly connected to the microchannels 22. As shown in FIG. 1C, the microchannels 22 have sidewalls 222 and a bottom 224 formed by the second side 10b of the substrate 10. The microchannels 22 are configured with dimensions such as widths, depths, and lengths selected to allow a conductive particle-containing liquid placed in the microchannels to flow along the channels. The conductive particle-containing liquid may be placed in the microchannels 22 by any suitable technique, and examples include, but are not limited to, chemical vapor deposition, physical vapor deposition, sputtering, spraying, air knife, gravure, dipping, kiss coating, flood coating, blading, immersion, Meyer rod, roll coating, slot die coating, inkjet printing, lithography, flexographic printing, screen printing, and mixtures and combinations thereof. In some embodiments, the dimensions of the microchannels 22 are selected such that the conductive particle-containing liquid can be placed in the microchannels 22 and flowed along the channels 22 primarily by capillary force. In some embodiments, the conductive particle-containing liquid can be applied to the microchannels 22 under pressure to enhance capillary flow, or can be moved through the microchannels 22 by a pump, by application of a vacuum, and the like. In some embodiments, the conductive particle-containing liquid can be applied to the microchannels 22 under pressure with an insignificant contribution from capillary flow, for example by roll coating the conductive particle-containing liquid.

Referring to the article shown in FIG. 1F, a conductive particle-containing liquid 42 is placed in the microchannels and flowed along the microchannels into the through holes 24 to make a direct contact to the contact pads 32 and 32' of the respective circuit dies 30 and 30'. It is to be understood that in some embodiments, when a through hole is not fluidly-connected to a microchannel, an electrical contact can be directly formed to the corresponding contact pad of the circuit die by at least partially filling the through hole with an electrically conductive material.

The conductive particle-containing liquid 42 can be any electrically conductive liquid composition containing conductive particles that is flowable, or can be made to flow, in the microchannels 22. In some embodiments, the conductive particle-containing liquid 42 can be formulated to allow flow along the microchannels 22 primarily by a capillary force.

In various embodiments, the conductive particle-containing liquid 42 can be any liquid composition that is electrically conductive in a liquid state (for example, metals), or is electrically non-conductive or weakly conductive in a liquid state and becomes electrically conductive when solidified. In some embodiments, the conductive particle-containing liquid 42 includes a sufficient amount of a liquid carrier to make the conductive particle-containing liquid flowable in the microchannels 22 primarily by a capillary force. In some embodiments, the conductive particle-containing liquid 42 can be made to flow in the microchannels 22 by applying the conductive particle-containing liquid under pressure in the microchannels 22 under pressure to enhance capillary flow.

The conductive particle-containing liquid 42 includes an electrically conductive material, or an electrically non-conductive material that can be converted into an electrically conductive material, which is dispersed in a liquid to facilitate more uniform deposition into the microchannels 22 by using, for example, a coater or sprayer. Suitable electrically conductive materials for the conductive particle-containing liquid 42 include, but are not limited to, metal particles, nanowires, metal salts that are conductive at room temperature or become conductive when heated or otherwise reduced to metals, conductive polymers, and mixtures and combinations thereof. In some embodiments, the conductive particle-containing liquid 42 includes conductive inks including a conductive metal such as silver ink, silver nanoparticle ink, reactive silver ink, copper ink, and conductive polymer inks, as well as liquid metals or alloys (e.g., metals or alloys that melt at relatively low temperatures and solidify at room temperatures), and the like. In some embodiments, the conductive particle-containing liquid 42 is a conductive ink that is activated or curable with actinic radiation such as, for example, a UV curable or activated ink.

In some embodiments, the conductive material in the conductive particle-containing liquid 42 may be silver flakes or spheres, a blend of carbon/graphite particles or a blend of silver flakes/carbon particles. Particle sizes typically range from, for example, about 0.5 micrometers to about 10.0 micrometers in diameter. When these flakes or particles are suspended in the polymer binder, they are randomly spaced through the liquid. Once the solvent is evaporated, they condense, forming a conductive path or circuit. Of the conductive materials, silver is the least resistive and the most expensive while carbon/graphite offers the best combination of low resistance and low price. Suitable conductive inks are commercially available from, for example, Tekra, Inc., New Berlin, WI; Creative Materials, Inc., Ayer, MA; or Nova-Centrix, Austin, TX.

Any non-corrosive liquid in which the conductive materials can form a stable dispersion can be used in the conductive particle-containing liquid 42, and suitable examples of liquid carriers include, but are not limited to, water, alcohols, ketones, ethers, hydrocarbons or an aromatic solvent (benzene, toluene, xylene, etc.). In some embodiments, the carrier liquid is volatile, having a boiling point of no more than 200 degrees C. (° C.), no more than 150° C., or no more than 100° C.

In addition, the conductive particle-containing liquid 42 may contain additives or binders to control viscosity, corrosion, adhesion, and dispersion of the conductive material. Examples of suitable additives or binders include, but are not limited to, carboxy methyl cellulose (CMC), 2-hydroxy ethyl cellulose (HEC), hydroxy propyl methyl cellulose (HPMC), methyl cellulose (MC), poly vinyl alcohol (PVA), tripropylene glycol (TPG), and xanthan gum (XG), and surfactants such as ethoxylates, alkoxylates, ethylene oxide and propylene oxide and their copolymers, sulfonates, sulfates, disulfonate salts, sulfosuccinates, phosphate esters, and fluorosurfactants (e.g., those available under the trade designation Zonyl from DowDuPont).

In one example, a conductive particle-containing liquid, or "ink," includes, by weight, from 0.0025% to 0.1% surfactant (e.g., a preferred range is from 0.0025% to 0.05% for Zonyl FSO-100), from 0.02% to 4% viscosity modifier (e.g., a preferred range is 0.02% to 0.5% for HPMC), from 94.5% to 99.0% solvent and from 0.05% to 1.4% conductive materials. Representative examples of suitable surfactants include those available from DowDuPont, Wilmington, DE, under the trade designations Zonyl FSN, Zonyl FSO, and Zonyl FSH, those available from Millipore Sigma, St. Louis, MO, under the trade designations Triton (x100, x114, x45), those available from Evonik Industries, Parsippany, NJ, under the trade designations Dynol (604,607), n-dodecyl b-D-maltoside and Novek. Examples of suitable viscosity modifiers include hydroxypropyl methyl cellulose (HPMC), methyl cellulose, xanthan gum, polyvinyl alcohol, carboxy methyl cellulose, hydroxy ethyl cellulose. Examples of suitable solvents that may be present includes the aforementioned liquid carriers, binders, or additives, including water and isopropanol.

In another embodiment, the conductive particle-containing liquid 42 can include an adhesive such as, for example, adhesives dissolved in liquid solvents such as water acetone, toluene, methyl ethyl ketone (MEK), and the like.

The conductive particle-containing liquid 42 can be cured, hardened or solidified by removing at least portion of the liquid carrier to leave a continuous layer of electrically conductive material that forms an electrically conductive trace in the microchannels 22 and the through holes 24. The conductive particle-containing liquid 42 may be cured and/or hardened or sintered. "Cured or solidified" refers to a process where the solvent or liquid carrier is removed from the conductive particle-containing liquid 42 to form an interconnect circuit pattern. Suitable curing conditions are well known in the art and include by way of example, heating, irradiating with visible or ultraviolet (UV) light, electron beams, and the like. Alternatively, "harden(s) or hardening" may be caused by solvent removal during drying, for example, without polymerization or cross-linking.

The conductive particle-containing liquid 42 can be delivered at any position along the microchannels 22. The conductive particle-containing liquid 42 can be deposited in the microchannels 22 by various methods including, for example, pouring, funneling, ink jet printing, piezo dispensing, needle dispensing, micro-injection, screen printing, flexographic printing, sputtering, vapor deposition, and the like.

Figure 1H:
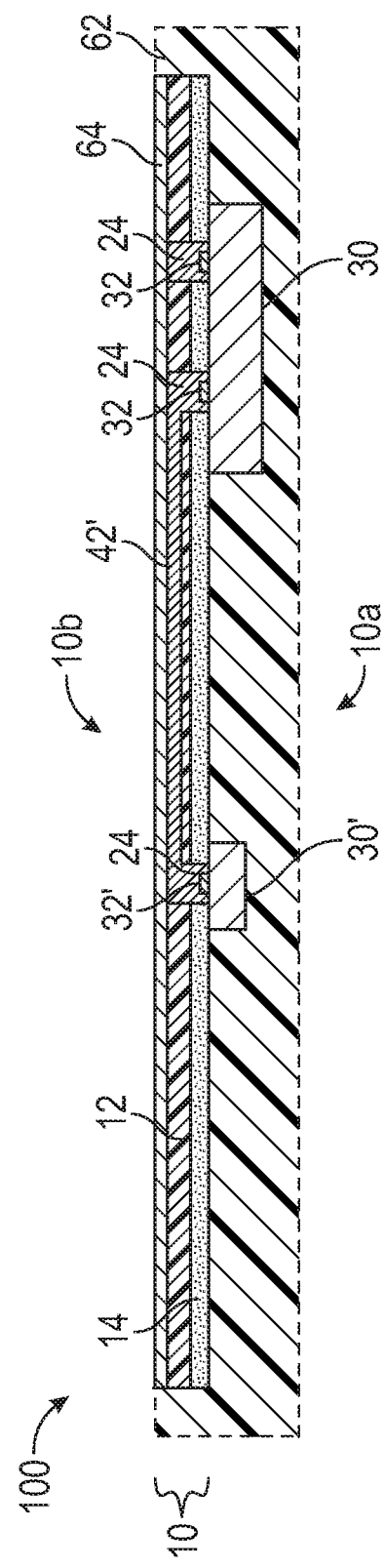
FIG. 1H is a cross-sectional view of the substrate of FIG. 1F where an overcoat layer is applied onto the substrate, according to one embodiment.

Referring to FIGS. 1E and 1F, the conductive particle-containing liquid 42 is placed in the microchannels 22 and flow to fill the through holes 24. Then the liquid 42 is solidified to form one or more electrically conductive channel traces 42' in the microchannels 22 and the through holes 24, as shown in FIG. 1G. The formed traces 42' can electrically connect a contact pad of a circuit die (e.g., the contact pad 32 of the circuit die 30) to a contact pad of another circuit die (e.g., the contact pad 32' of the circuit die 30'). The liner 16 on the second side 10b of the substrate 10 can protect the substrate 10 from contamination. For example, the liquid 42 may overflow onto the liner 16 when filling the microchannels 22 and/or the through holes 24. In other embodiments the liquid 42 may be applied uniformly across the second major side 10b of the substrate 10 and then scraped by a doctor blade to remove any excess, at least partially filling the microchannels 22 and through holes 24, and leaving behind a thin residual layer of the liquid 42 on the second major side 10b. The liner 16 can be removed from the substrate 10 before or after the formation of the traces 42'. An overcoat layer 64 is then applied to cover the second side 10b of the substrate 10 to protect the underneath traces 42', as shown in FIG. 1H. The overcoat layer 64 can include any suitable materials such as, for example, polyurethane, epoxy, acrylates including urethane acrylates, silicones, polydimethylsiloxane (PDMS), etc. In some embodiments the overcoat layer 64 may have the same composition as the encapsulant material 62.

As depicted in the embodiment of FIG. 1H, the electronic device 100 has a multi-layered structure. The electronic device 100 has the substrate 10 that includes the flexible backing layer 12 and the adhesive surface 14 on the first major side 10a thereof, with the liner 16 removed. The substrate 10 further includes the pattern of microchannels 22 on the second major side 10b opposite the adhesive surface 12, and the through holes 24 fluidly connected to the pattern of microchannels 22. The through holes 24 each extend through the substrate 10 between the first and second major sides 10a and 10b. The solid circuit dies 30 and 30' are disposed on the adhesive surface 14 of the substrate 10. The respective major surfaces 31 and 31' of each solid circuit dies are aligned and attached to the adhesive surface 14 of the substrate 10 such that the contact pads 32 and 32' on the major surfaces 31 and 31' of each solid circuit dies at least partially overlie the corresponding through holes 24 of the substrate 10. The electrically conductive channel traces 42' are formed in the pattern of microchannels 22 on the second side 10b to electrically connect to the contact pads of the solid circuit dies via the through holes 24.

The electronic device 100 is a multi-layered circuit which refers to stacks of conductive components, in varying thicknesses, separated from one another by stacks of nonconductive (i.e., dielectric) components, in varying thicknesses, having through holes that provide electrical contact between the conductive stacks. For example, the electronic device 100 has the solid circuit dies on the first side 10a and the electrically conductive channel traces 42' formed on the second side 10b to electrically connect to the contact pads of the solid circuit dies via the through holes 24.

Figure 2A:
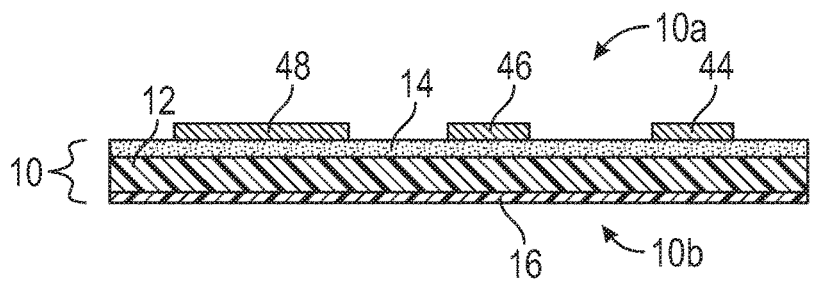
FIG. 2A is a cross-sectional view of a substrate, according to one embodiment.
Figure 2A:
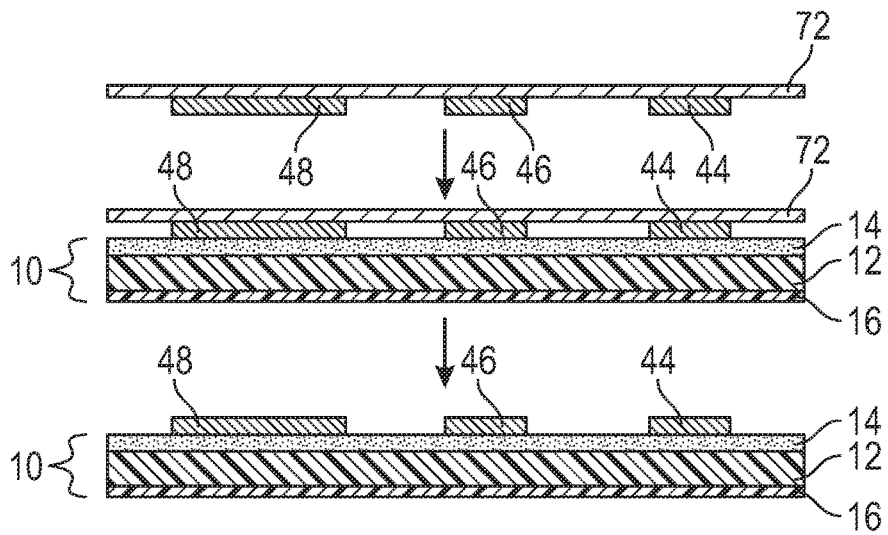
Figure 2B:
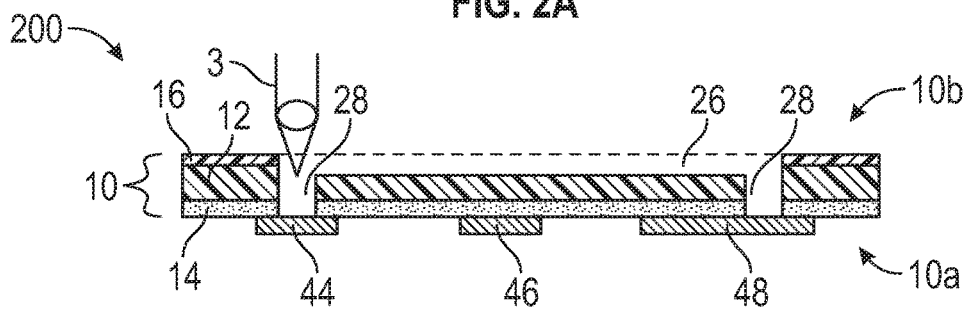
FIG. 2B is a cross-sectional view of the substrate of FIG. 2A where a pattern of microchannels and through holes are formed by laser cutting, according to one embodiment.
Figure 2C:
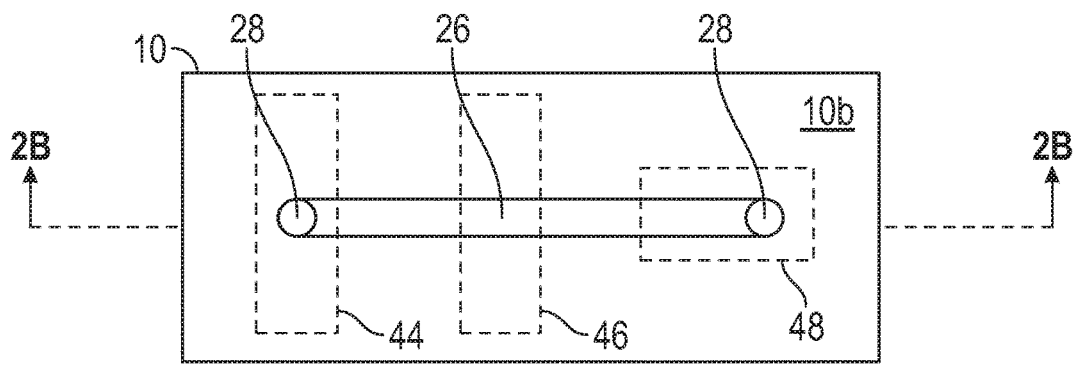
FIG. 2C is a plan view of the substrate of FIG. 2B.

In some embodiments, one or more electrically conductive surface traces can be formed on the side of adhesive surface of the substrate, and at least one of the through holes can be formed to provide an access to at least one of the surface traces from the opposite side of the substrate. FIGS. 2A-C illustrate a process of forming an article 200. FIG. 2A is a cross-sectional view of a substrate 10 having a pattern of electrically conductive surface traces 42, 44 and 46 disposed thereon, according to one embodiment. The substrate 10 includes a flexible backing layer 12 with an adhesive surface 14 on a first major side 10a thereof. The substrate 10 further includes a removable liner 16 attached to the flexible backing layer 12 on a second major side 10b thereof, opposite to the first major side 10a. The surface traces 44, 46 and 48 are adhesively bonded to the adhesive surface 14 on the first side 10a of the substrate 10. In some embodiments, one or more surface traces can be disposed on the adhesive surface 14. In some embodiments, one or more surface traces can be disposed between the backing layer 12 and the adhesive surface 14.

The pattern of electrically conductive surface traces 44, 46 and 48 can be formed on the adhesive surface 14 of the substrate 10 by any suitable processes. FIG. 2A' illustrates an exemplary process of forming the article of FIG. 2A, according to one embodiment. The surface traces 44, 46 and 48 are first formed on a liner 72, e.g., by printing or etching. The surface traces 44, 46 and 48 are then transferred to the adhesive surface 14 of the substrate 10 by forming adhesive bonding between the surface traces and the adhesive surface of the substrate.

It is to be understood that the electrically conductive surface traces can be formed on the adhesive surface of the substrate by any other suitable methods. In some embodiments, a pattern of electrically conductive surface traces can be formed on the adhesive surface of the substrate by direct printing. In some embodiments, a pattern of electrically conductive surface traces can be formed on the adhesive surface of the substrate by laminating a layer of electrically conductive material (e.g., a metal foil) which is then etched to form the pattern.

After the formation of the surface traces on the first side 10a of the substrate 10, a pattern of microchannels and through holes can be formed on the opposite side 10b of the substrate 10. As shown in FIGS. 2B-C, a pattern of microchannels 26 and through holes 28 are formed on the second side 10b of the substrate 10. The through holes 28 provide fluid access to the surface traces 48 and 44 from the opposite side 10b. The microchannel 26 fluidly connects the through holes 28 at the opposite ends thereof such that an electrically conductive trace can be formed in the microchannel 26 to electrically connect the surface traces 48 and 44 on the opposite side of the substrate 10.

FIG. 2B is a cross-sectional view of the substrate 10 where a pattern of microchannels 26 and through holes 28 are formed by laser cutting, according to one embodiment. The substrate 10 is drilled with a laser 3 from the second side 10b so that the laser 3 can cut through the liner 16 into the flexible backing layer 12 to form a pattern of microchannels 28, and cut through the substrate 10 to form the through holes 28. The through holes 28 each have a bottom surface being the rear side of the respective surface traces 44, 46 and 48.

In one example, the laser used to make the substrate is an Avia 7 UV 355 nm laser (obtained from Coherent® of Santa Clara, CA United States) with a power of about 3.5-3.6 W. The laser is directed at the liner side of the substrate and moved over the substrate in 20-30 passes at a speed of 500 mm/sec, with a hatch spacing of 0.025 mm.

In another example, the laser used to make the microchannels and through holes is a 400 watt Coherent E400i, $CO_2$ laser, running at a 9.4 micron wavelength. The laser is directed at the PET side of the layered film construction. The partial channels are cut with one pass at marking speed of 1000 mm/s with 100 kHz pulse rate, and about 64 watts of power. The microchannels formed in the substrate were linear with a generally rectangular or hemispherical in cross-section, cut into about ⅔ of the polyurethane layer, and a width of about 160 micrometers. The through holes were cut using a circular path at a marking speed of 1000 mm/sec, 100 kHz pulse rate, and about 28 watts of power with two passes. The through holes formed were semi-cone shaped with a top diameter of about 500 micrometers and a bottom diameter of about 300 micrometers.

After the formation of the microchannels 26 and the through holes 28, a conductive particle-containing liquid (e.g., the liquid 42 in FIG. 1F) can be placed in the microchannels 26 and flow along the microchannels into the through holes 28 to make a direct contact to the rear sides of the respective surface traces 48 and 44. After solidification of the conductive particle-containing liquid, a pattern of electrically conductive channel traces can be formed on the second side 10b of the substrate 10 to electrically connect two or more components on the opposite side 10a of the substrate 10 including, for example, the surface traces/contacts 48 and 44. As shown in FIG. 2C, an electrically conductive channel trace formed in the microchannel 26 on the second side 10b of the substrate 10 can overlie the surface trace 46 on the opposite side 10a, but is electrically isolated from the surface trace 46 via the substrate 10.

As depicted in the embodiment of FIG. 2B-2C, the electronic device 200 has a multi-layered structure. The electronic device 200 has the substrate 10 that includes the flexible backing layer 12 and the adhesive surface 14 on the first major side 10a thereof. The substrate 10 further includes the pattern of microchannels 26 on the second major side 10b opposite the adhesive surface 12, and the through holes 24 fluidly connected to the pattern of microchannels 26. The through holes 28 each extend through the substrate 10 between the first and second major sides 10a and 10b. The electrically conductive surface traces 44, 46 and 48 are disposed on the first side 10a of the substrate 10 via the adhesive surface 14. The surface traces 44 and 48 at least partially overlie the corresponding through holes 28 of the substrate 10. Electrically conductive channel traces can be formed in the pattern of microchannels 26 on the second side 10b to electrically connect to the surface traces 44 and 48 via the through holes 28.

The electronic device 200 is a multi-layered circuit which refers to stacks of conductive components, in varying thicknesses, separated from one another by stacks of nonconductive (i.e., dielectric) components, in varying thicknesses, having through holes that provide electrical contact between the conductive stacks. For example, the electronic device 200 has the surface traces on the first side 10a and the electrically conductive channel traces formed on the second side 10b to electrically connect to the surface traces via the through holes.

FIGS. 3A-F illustrate a process of making a multi-layered circuit 300, according to one embodiment. A multi-layered circuit described herein may refer to stacks of conductive components, in varying thicknesses, separated from one another by stacks of nonconductive (i.e., dielectric) components, in varying thicknesses, having through holes that provide electrical contact between the conductive stacks. FIG. 3A is a cross-sectional view of a substrate 10 having one or more surface traces/contacts 40 on one side 10a, a pattern of microchannels 22' on the other side 10b of the substrate 10, and through holes 24 and 28, according to one embodiment. A pattern of surface traces/contacts 40, 41 and 43 are formed on the adhesive surface 14 of the substrate 10. The through holes (e.g., 28) overlie the surface traces/contacts on the first side 10a to provide an access to the surface traces/contacts from the second side 10b of the substrate 10.

As shown in FIG. 3B, solid circuit dies 30 and 30' are disposed on the first side 10a of the substrate 10, e.g., adhesively bonded to the adhesive surface 14 of the substrate 10. The respective major surfaces 31 and 31' of each solid circuit dies are aligned and attached to the adhesive surface 14 of the substrate 10 such that the contact pads 32 and 32' on the major surfaces 31 and 31' of each solid circuit dies at least partially overlie the corresponding through holes 24 of the substrate 10. As shown in FIG. 3C, through holes 28 overlie the surface trace/contact 40; through holes 21 and 23 overlie the surface traces/contacts 41 and 43, respectively. The through holes (e.g., 21, 23, 24, or 28) provide an access to the contact pads of the solid circuit dies or the surface traces/contacts on one side 10a from the opposite side 10b of the substrate 10.

As shown in FIG. 3D, a conductive particle-containing liquid 42 is placed in the microchannels and flowed along the microchannels into the through holes to at least partially overlie and make a direct contact to the contact pads 32 and 32' of the respective circuit dies 30 and 30', and the surface trace/contact 40.

After solidification of the liquid 42, a pattern of electrically conductive traces 42' is formed on the second side 10b to electrically connect two or more components on the opposite side 10a of the substrate 10 including, for example, one or more of the solid circuit dies 30 and 30' and one or more of the surface traces/contacts (e.g., 40). As shown in FIGS. 3D-F, a protective liner 16 is removed from the substrate 10 after the formation of the pattern of electrically conductive traces 42. Then, an overcoat layer 64 is applied to cover the second side 10b of the substrate 10.

As depicted in the embodiment of FIG. 3F, the electronic device 300 has a multi-layered structure. The electronic device 300 has the substrate 10 that includes the flexible backing layer 12 and the adhesive surface 14 on the first major side 10a thereof. The substrate 10 further includes the pattern of microchannels 22' on the second major side 10b opposite the adhesive surface 12, and some of the through holes 24 and 28 fluidly connected to the pattern of microchannels 22'. The through holes 24 and 28 each extend through the substrate 10 between the first and second major sides 10a and 10b. The solid circuit dies 30 and 30' and the surface traces 40 41, and 43 are disposed on the first side 10a of the substrate 10 via the adhesive surface 14. The contact pads 32 and 32' of the solid circuit dies at least partially overlie the corresponding through holes 24 of the substrate 10. The electrically conductive surface trace 40 is disposed on the first side 10a of the substrate 10 via the adhesive surface 14. The surface trace 40 at least partially overlie the through holes 28 of the substrate 10. The electrically conductive channel trace 42' is formed in the pattern of microchannels 22' on the second side 10b to electrically connect to the contact pads of the solid circuit dies via the through holes 24.

The electronic device 300 is a multi-layered circuit which refers to stacks of conductive components, in varying thicknesses, separated from one another by stacks of nonconductive (i.e., dielectric) components, in varying thicknesses, having through holes that provide electrical contact between the conductive stacks. For example, the electronic device 300 has the solid circuit dies 30 and 30' and the surface trace 40 formed on the first side 10a, and the electrically conductive channel traces 42' formed on the second side 10b to electrically connect to the contact pads 32 and 32' of the solid circuit dies via the through holes 24 and electrically connect to the surface trace 40 via the through holes 28.

The operation of the present disclosure will be further described with regard to the following embodiments. These embodiments are offered to further illustrate the various specific and preferred embodiments and techniques. It should be understood, however, that many variations and modifications may be made while remaining within the scope of the present disclosure.

Listing of Exemplary Embodiments

It is to be understood that any one of embodiments 1-11 and 12-20 can be combined.

Embodiment 1 is an electronic device comprising:
  a flexible substrate including an adhesive surface on a first major side thereof, a pattern of microchannels on a second major side opposite the first major side, and one or more through holes connected to the pattern of microchannels, at least one of the through holes extending through the substrate between the first and second major sides; and
  one or more solid circuit dies adhesively bonded to the adhesive surface of the substrate such that one or more contact pads of the solid circuit dies at least partially overlie and face the one or more through holes of the substrate.

Embodiment 2 is the device of embodiment 1, further comprising one or more electrically conductive channel traces formed in the pattern of microchannels and the through holes to electrically connect to the one or more contact pads of the solid circuit dies.

Embodiment 3 is the device of embodiment 1 or 2, wherein the flexible substrate includes a polymeric backing layer, and the pattern of microchannels is formed partially into the polymeric backing layer from the second major side of the substrate.

Embodiment 4 is the device of embodiment 3, wherein the flexible substrate further includes a liner disposed on the polymeric backing layer on the second major side thereof, and the pattern of microchannels penetrates through the liner.

Embodiment 5 is the device of any one of embodiments 1-4, further comprising an encapsulating layer to encapsulate the solid circuit die on first major side of the substrate.

Embodiment 6 is the device of any one of embodiments 1-5, further comprising one or more electrically conductive surface traces disposed on the first major side of the substrate to overlie at least one of the one or more through holes.

Embodiment 7 is the device of embodiment 6, wherein at least one microchannel of the pattern of microchannels fluidly connects at least one of the contact pads of the solid circuit dies and the surface trace via the respective through holes.

Embodiment 8 is the device of embodiment 6 or 7, wherein at least one microchannel of the pattern of microchannels fluidly connects first and second surface traces of the surface traces via the respective through holes.

Embodiment 9 is the device of any one of embodiments 1-8, wherein at least one microchannel of the pattern of microchannels fluidly connects the respective contact pads of first and second dies of the solid circuit dies via the respective through holes.

Embodiment 10 is the device of any one of embodiments 1-9, further comprising an overcoat layer to cover the first major side of the substrate.

Embodiment 11 is the device of any one of embodiments 1-10, wherein the adhesive surface comprises a structural adhesive including at least one of polyurethane, epoxy, silicone, or urethane-acrylate.

Embodiment 12 is a method of making an electronic device comprising:
- providing a flexible substrate having an adhesive surface on a first major side thereof;
- providing a pattern of microchannels on a second major side of the substrate opposite the adhesive surface;
- providing one or more through holes connected to the pattern of microchannels, at least one of the through holes extending through the substrate between the first and second major sides;
- providing a solid circuit die on the adhesive surface of the substrate such that one or more contact pads of the solid circuit die at least partially overlie and face the one or more through holes of the substrate;
- providing a conductive particle-containing liquid in the pattern of microchannels and the one or more through holes to contact the one or more contact pads; and
- solidifying the conductive particle-containing liquid to form one or more electrically conductive channel traces to electrically connect to the one or more contact pads of the solid circuit die.

Embodiment 13 is the method of embodiment 12, wherein the flexible substrate includes a polymeric backing layer, and the pattern of microchannels is formed partially into the polymeric backing layer from the second major side of the substrate.

Embodiment 14 is the method of embodiment 12 or 13, wherein the flexible substrate further includes a liner disposed on the polymeric backing layer on the second major side thereof, and providing the pattern of microchannels further comprises cutting completely through the liner and partially into the polymeric backing layer from the second major side.

Embodiment 15 is the method of embodiment 14, further comprising peeling the liner from the substrate.

Embodiment 16 is the method of any one of embodiments 12-15, wherein providing the one or more through holes comprises cutting completely through the substrate.

Embodiment 17 is the method of any one of embodiments 12-16, wherein providing the pattern of microchannels comprises laser-cutting the substrate from the second major side.

Embodiment 18 is the method of any one of embodiments 12-17, further comprising providing a removable liner to support the substrate on the second side thereof.

Embodiment 19 is the method of any one of embodiments 12-18, further comprising applying an encapsulating layer to encapsulate the solid circuit dies on the second side of the substrate.

Embodiment 20 is the method of any one of embodiments 12-19, further comprising providing one or more electrically conductive surface trace disposed on the first major side of the substrate to overlie at least one of the one or more through holes.

The operation of the present disclosure will be further described with regard to the following detailed examples. These examples are offered to further illustrate the various specific and preferred embodiments and techniques. It should be understood, however, that many variations and modifications may be made while remaining within the scope of the present disclosure.

EXAMPLES

These Examples are merely for illustrative purposes and are not meant to be overly limiting on the scope of the appended claims. Notwithstanding that the numerical ranges and parameters setting forth the broad scope of the present disclosure are approximations, the numerical values set forth in the specific examples are reported as precisely as possible. Any numerical value, however, inherently contains certain errors necessarily resulting from the standard deviation found in their respective testing measurements. At the very least, and not as an attempt to limit the application of the doctrine of equivalents to the scope of the claims, each numerical parameter should at least be construed in light of the number of reported significant digits and by applying ordinary rounding techniques.

Summary of Materials

Unless otherwise noted, all parts, percentages, ratios, etc. in the Examples and the rest of the specification are by weight. In addition, Table 1 provides abbreviations and a source for all materials used in the Examples below:

TABLE 1

| Abbreviation | Description | Source |
| --- | --- | --- |
| COTRAN | 3.5 mil Polyurethane film with a 1 mil PET liner available under the trade designation COTRAN 9701 | 3M Company, St. Paul, MN |
| VHB | a strong, stretchable, clear adhesive made from acrylic foam. It has an elasticity modulus of about 1.8 MPa, available under the trade designation Very High Bond (VHB) Tape 4910 | 3M Company, St. Paul, MN |
| Ink | a silver flake ink that becomes conductive after solidification, available under the trade designation 127-07. | Creative Materials Inc, Ayer, MA |

Test Methods

The following test methods have been used in evaluating some of the Examples of the present disclosure.

The Examples were subjected to compression and extensional forces in a flex test using a Desktop Model Endurance Testing Jig, available from Yausa System Co. LTD., Okayama City, Japan. The Examples were flexed for 1000-100,000 cycles to a minimum bend radius of 0.25-0.6 inches. The Bluetooth signal of the Examples is read from a Samsung Galaxy S5 phone periodically throughout the test to determine if the Examples are still working. The Examples were also visually inspected periodically for signs of delamination or other failure modes. For Examples 1 and 2, the film stack can be flexibly bent or stretched without having the circuit dies to peel or pop off and without deteriorating the electrical interconnections.

Example 1

Example 1 is prepared using a film stack with a layered construction of: 3M VHB adhesive (2 mil or 0.05 mm thick)/COTRAN polyurethane (3.5 mil or 0.09 mm thick)/1.5 mil or 0.04 mm thick PET liner. Example 1 is drilled with a laser so that the laser cut through the PET liner into the polyurethane to form a pattern of microchannels and cut completely through all the layers to form through holes.

Figure 4:
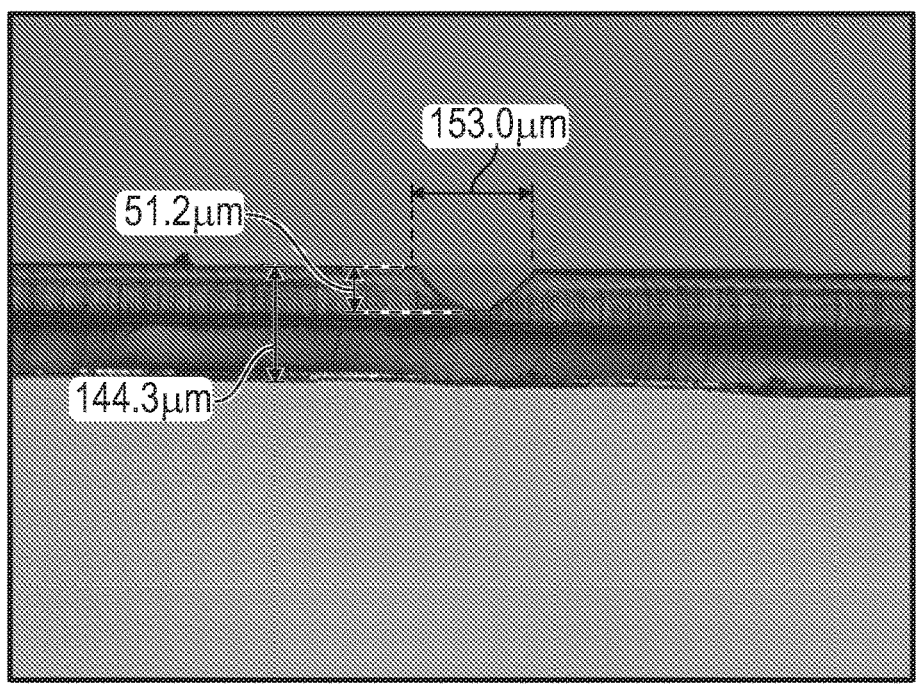
FIG. 4 is an optical image of a cross sectional view of a partial channel in a substrate stack.

FIG. 4 shows an optical image of a cross sectional view of one microchannel in the film stack.

The laser used to make the microchannels and through holes is a 400 watt Coherent E400i, CO2 laser, running at a 9.4 micron wavelength. The laser is directed at the PET side of the layered film construction. The partial channels are cut with one pass at marking speed of 1000 mm/s with 100 kHz pulse rate, and about 64 watts of power. The microchannels formed in the substrate are substantially linear with a generally rectangular or hemispherical in cross-section, cut into about ⅔ of the polyurethane layer, and a width of about 160 micrometers. The through holes are cut using a circular path at a marking speed of 1000 mm/sec, 100 kHz pulse rate, and about 28 watts of power with two passes. The through holes formed are semi-cone shaped with a top diameter of about 500 micrometers and a bottom diameter of about 300 micrometers.

A circuit die (Zero-Drift Amplifier 1 Circuit Rail-to-Rail 8-LFCSP-WD with a manufacturer part number of ADA4528-1ACPZ-R7 from Analog Devices Inc., Norwood, MA United States) is placed directly on the adhesive surface of the film stack, with its contact pads face down, and then pressed with a force for a few seconds to form a strong adhesive bonding. The microchannels and through holes are arranged to form contacts to the configuration of the contact pads on the circuit die.

A silver flake ink is available under the trade designation 127-07 from Creative Materials, Ayer, MA A 40% silver loading is then doctor bladed in the pattern of microchannels and through holes to make contact to the contact pads of the solid circuit die in the through holes. The silver ink is solidified by heating at 98° C. for about 5 to 10 minutes to form electrically conductive traces. The PET liner is removed after the filling of the silver ink.

Example 2

Figure 5:
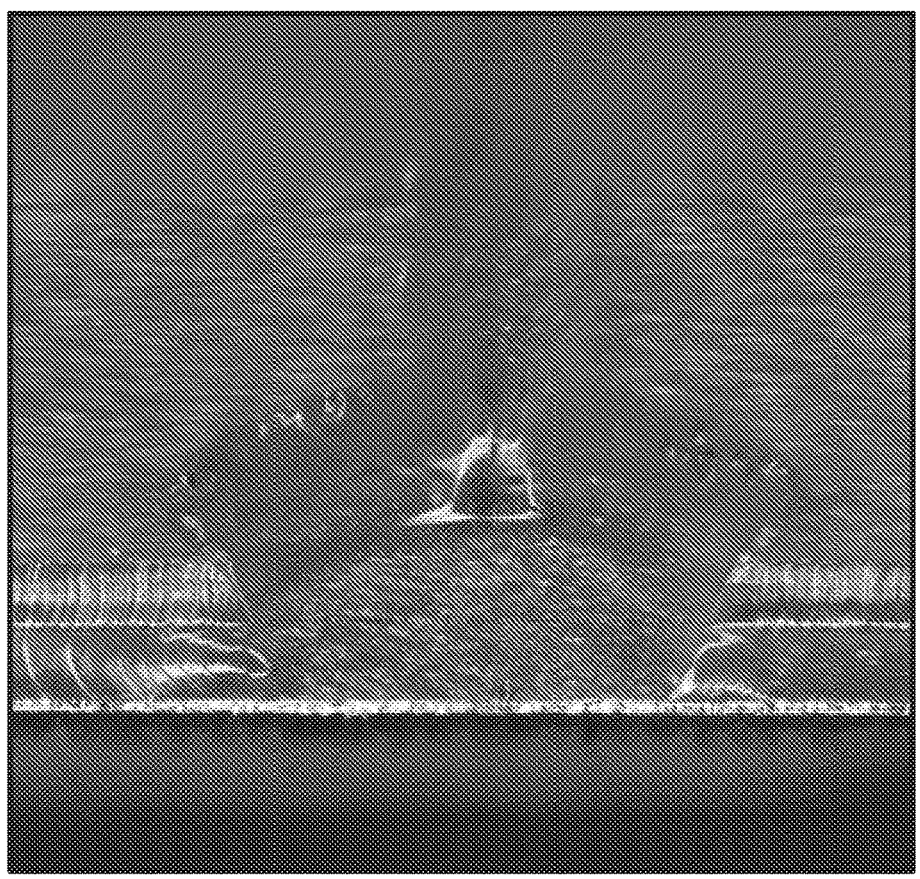
FIG. 5 is an optical image of a pattern of microchannels connected to a through hole that is cut through the film stack.

A film stack is prepared with a layered construction of: 3M VHB adhesive (2 mil or 0.05 mm thick)/COTRAN polyurethane (3.5 mil or 0.09 mm thick)/PET liner (1.5 mil or 0.04 mm thick). A copper trace (0.013 mm thick, and 0.5 mm wide) is adhesively bonded to the adhesive surface of the film stack. A laser is used to drill the film stack from the side of PET liner so that the laser cuts through the PET liner into about ⅔ depth of the polyurethane layer to form a pattern of microchannels and cuts completely through film stack to reach the copper trace to form through holes. FIG. 5 shows a 3D optical image of a pattern of microchannels connected to a through hole that is cut through the film stack. The microchannel shown in FIG. 5 has similar dimensions as that in FIG. 4.

A silver flake ink is available under the trade designation 127-07 from Creative Materials, Ayer, MA A 40% silver loading is then doctor bladed in the pattern of microchannels and through holes to make contact to the contact pads of the solid circuit die in the through holes. The silver ink is solidified by heating at 98° C. for about 5 to 10 minutes to form electrically conductive traces. The PET liner is removed after the filling of the silver ink.

Example 3

Example 3 was prepared using a film stack with a layered construction of: 3M Silicone adhesive 91022 (2 mil thick)/COTRAN polyurethane (3.5 mil or 0.09 mm thick)/PET liner (1.5 mil or 0.04 mm thick). Example 3 is drilled with a laser so that the laser cut through the PET liner into the polyurethane to form a pattern of microchannels and cut completely through all the layers to form through holes.

The laser used to make the microchannels and through holes is a 400 watt Coherent E400i, CO2 laser, running at a 9.4 micron wavelength. The laser is directed at the PET side of the layered film construction. The partial channels are cut with one pass at marking speed of 1000 mm/s with 100 kHz pulse rate, and about 64 watts of power. The microchannels formed in the substrate are substantially linear with a generally rectangular or hemispherical in cross-section, cut to a depth of about ⅔ the thickness of the polyurethane layer, and a width of about 160 micrometers. The through holes were cut using a circular path at a marking speed of 1000 mm/sec, 100 kHz pulse rate, and about 28 watts of power with two passes. The through holes formed are semi-cone shaped with a top diameter of about 500 micrometers and a bottom diameter of about 300 micrometers.

A packaged Bluetooth circuit die (Taiyo Yuden EYSHSNZWZ low energy module, Taiyo Yuden Co. LTD. Japan), a battery (Panasonic 3V CR 1616, Panasonic,) and three capacitors (4.7 uF, 1 uF, and 0.1 uF), were placed directly on the adhesive surface of the film stack, with contact pads face down, and then pressed with a force for a few seconds to form a strong adhesive bonding. The microchannels and through holes are arranged to form contacts to the configuration of the contact pads on the circuit die.

An encapsulating layer of Sylgard 184 was applied over the adhesive and the circuit components such that the tallest component was encapsulated under approximately 1 mil of the encapsulating layer. This was done by creating a rigid mold around the components and pouring the encapsulating material into the mold. This layer was cured at room temperature for 24 hours.

A silver flake ink is available under the trade designation 127-07 from Creative Materials, Ayer, MA A 40% silver loading is then doctor bladed in the pattern of microchannels (on the PET/Polyurethane side) and through holes to make contact to the contact pads of the solid circuit die in the through holes. The silver ink is solidified by heating at 98° C. for about 5 to 10 minutes to form electrically conductive traces. The PET liner is removed after the filling of the silver ink.

The device was then programmed with firmware through a Nordic Semi nRF5x device before another encapsulating layer (Sylgard 184) was coated over the silver ink and the polyurethane side via notch bar to a thickness of approximately 2 mil. This second encapsulating layer was then cured at room temperature for 24 hours, after which the device was tested using the method described above. Reference throughout this specification to "one embodiment," "certain embodiments," "one or more embodiments" or "an embodiment," whether or not including the term "exemplary" preceding the term "embodiment," means that a particular feature, structure, material, or characteristic described in connection with the embodiment is included in at least one embodiment of the certain exemplary embodiments of the present disclosure. Thus, the appearances of the phrases such as "in one or more embodiments," "in certain embodiments," "in one embodiment" or "in an embodiment" in various places throughout this specification are not necessarily referring to the same embodiment of the certain exemplary embodiments of the present disclosure. Furthermore, the particular features, structures, materials, or characteristics may be combined in any suitable manner in one or more embodiments.

While the specification has described in detail certain exemplary embodiments, it will be appreciated that those skilled in the art, upon attaining an understanding of the foregoing, may readily conceive of alterations to, variations of, and equivalents to these embodiments. Accordingly, it should be understood that this disclosure is not to be unduly limited to the illustrative embodiments set forth hereinabove. In particular, as used herein, the recitation of numerical ranges by endpoints is intended to include all numbers subsumed within that range (e.g., 1 to 5 includes 1, 1.5, 2, 2.75, 3, 3.80, 4, and 5). In addition, all numbers used herein are assumed to be modified by the term "about."

Furthermore, all publications and patents referenced herein are incorporated by reference in their entirety to the same extent as if each individual publication or patent was specifically and individually indicated to be incorporated by reference. Various exemplary embodiments have been described. These and other embodiments are within the scope of the following claims.

What is claimed is:

1. A device comprising:
a flexible substrate including an adhesive surface on a first major side thereof, a pattern of microchannels on a second major side opposite the first major side, and one or more through holes connected to the pattern of microchannels, at least one of the through holes extending through the substrate between the first and second major sides; and
one or more solid circuit dies adhesively bonded to the adhesive surface of the substrate, the one or more solid circuit dies including one or more contact pads that at least partially overlie and face the one or more through holes of the substrate,
wherein the flexible substrate includes a polymeric backing layer, and the pattern of microchannels is formed partially into the polymeric backing layer from the second major side of the substrate.

2. The device of claim 1, further comprising one or more electrically conductive channel traces formed in the pattern of microchannels and the through holes to electrically connect to the one or more contact pads of the solid circuit dies.

3. The device of claim 1, wherein the flexible substrate further includes a liner disposed on the polymeric backing layer on the second major side thereof, and the pattern of microchannels penetrates through the liner.

4. The device of claim 1, further comprising an encapsulating layer to encapsulate the solid circuit die on first major side of the substrate.

5. The device of claim 1, further comprising one or more electrically conductive surface traces disposed on the first major side of the substrate to overlie at least one of the one or more through holes.

6. The device of claim 5, wherein at least one microchannel of the pattern of microchannels fluidly connects at least one of the contact pads of the solid circuit dies and the surface trace via the respective through holes.

7. The device of claim 5, wherein at least one microchannel of the pattern of microchannels fluidly connects first and second surface traces of the surface traces via the respective through holes.

8. The device of claim 1, wherein at least one microchannel of the pattern of microchannels fluidly connects the respective contact pads of first and second dies of the solid circuit dies via the respective through holes.

9. The device of claim 1, further comprising an overcoat layer to cover the first major side of the substrate.

10. The device of claim 1, wherein the adhesive surface comprises a structural adhesive including at least one of polyurethane, epoxy, silicone, or urethane-acrylate.

11. A method of making a device comprising:
forming an adhesive surface on a first major side of a flexible substrate;
forming a pattern of microchannels on a second major side of the substrate opposite the adhesive surface;
forming one or more through holes connected to the pattern of microchannels, at least one of the through holes extending through the substrate between the first and second major sides;
attaching a solid circuit die on the adhesive surface of the substrate such that one or more contact pads of the solid circuit die at least partially overlie and face the one or more through holes of the substrate;
disposing a conductive particle-containing liquid in the pattern of microchannels and the one or more through holes to contact the one or more contact pads; and
solidifying the conductive particle-containing liquid to form one or more electrically conductive channel traces to electrically connect to the one or more contact pads of the solid circuit die.

12. The method of claim 11, wherein the flexible substrate includes a polymeric backing layer, and the pattern of microchannels is formed partially into the polymeric backing layer from the second major side of the substrate.

13. The method of claim 11, wherein the flexible substrate further includes a liner disposed on the polymeric backing layer on the second major side thereof, and providing the pattern of microchannels further comprises cutting completely through the liner and partially into the polymeric backing layer from the second major side.

14. The method of claim 13, further comprising peeling the liner from the substrate.

15. The method of claim 11, wherein forming the one or more through holes comprises cutting completely through the substrate.

16. The method of claim 11, wherein forming the pattern of microchannels comprises laser-cutting the substrate from the second major side.

17. The method of claim 11, further comprising providing a removable liner to support the substrate on the second side thereof.

18. The method of claim 11, further comprising applying an encapsulating layer to encapsulate the solid circuit dies on the second side of the substrate.

19. The method of claim 11, further comprising disposing one or more electrically conductive surface trace on the first major side of the substrate to overlie at least one of the one or more through holes.

20. A device comprising:
a flexible substrate including an adhesive surface on a first major side thereof, a pattern of microchannels on a second major side opposite the first major side, and one or more through holes connected to the pattern of microchannels, at least one of the through holes extending through the substrate between the first and second major sides; and
one or more solid circuit dies adhesively bonded to the adhesive surface of the substrate, the one or more solid circuit dies including one or more contact pads that at least partially overlie and face the one or more through holes of the substrate;
the device further comprising one or more electrically conductive surface traces disposed on the first major side of the substrate to overlie at least one of the one or more through holes.

* * * * *